US 10,605,846 B2

(12) United States Patent
Katrak

(10) Patent No.: US 10,605,846 B2
(45) Date of Patent: Mar. 31, 2020

(54) DIAGNOSTIC SYSTEM FOR A VEHICLE ELECTRICAL SYSTEM HAVING A VOLTAGE REGULATOR

(71) Applicant: LG Chem, Ltd., Seoul (KR)

(72) Inventor: Kerfegar K. Katrak, Fenton, MI (US)

(73) Assignee: LG Chem, Ltd., Seoul (KR)

( * ) Notice: Subject to any disclaimer, the term of this patent is extended or adjusted under 35 U.S.C. 154(b) by 145 days.

(21) Appl. No.: 16/038,331

(22) Filed: Jul. 18, 2018

(65) Prior Publication Data
US 2019/0033358 A1    Jan. 31, 2019

Related U.S. Application Data

(60) Provisional application No. 62/538,990, filed on Jul. 31, 2017.

(51) Int. Cl.
| H02M 1/32 | (2007.01) |
| G01R 31/00 | (2006.01) |
| G05F 1/575 | (2006.01) |
| G05B 23/02 | (2006.01) |
| G07C 5/00 | (2006.01) |

(52) U.S. Cl.
CPC .......... *G01R 31/007* (2013.01); *G05B 23/02* (2013.01); *G05F 1/575* (2013.01); *G07C 5/00* (2013.01)

(58) Field of Classification Search
CPC .... G01R 31/50; G01R 21/005; G01R 21/006; G01R 21/10; G01R 31/343; G01R 31/007; G01R 31/006; H02M 1/32; H02P 29/0241
See application file for complete search history.

(56) References Cited

U.S. PATENT DOCUMENTS

| 7,432,719 B2 * | 10/2008 | Nozaki | ................. | B60L 3/0046 324/522 |
| 9,952,261 B2 * | 4/2018 | Ewing | ...................... | H04Q 9/00 |
| 2007/0120530 A1 * | 5/2007 | Nozaki | ................. | H02J 7/1461 320/130 |

OTHER PUBLICATIONS

U.S. Appl. No. 16/014,422, filed Jun. 21, 2018 entitled Diagnostic System for a Vehicle Electrical System.
U.S. Appl. No. 16/044,671, filed Jul. 25, 2018 entitled Diagnostic System for a Vehicle Electrical System Having First and Second Voltage Regulators.

* cited by examiner

*Primary Examiner* — Alesa Allgood
(74) *Attorney, Agent, or Firm* — Buckert Patent & Trademark Law Firm PC; John F. Buckert

(57) ABSTRACT

A diagnostic system having first and second applications is provided. The first application multiplies a first voltage value associated with a voltage regulator by a first correction value to obtain a first corrected voltage value. The first application receives a second corrected voltage value from the second application. The first application sets a first voltage regulator status flag equal to a first fault value when a difference between the first and second corrected voltage values is greater than a threshold difference value. The first diagnostic handler application generates control signals if the first voltage regulator status flag is equal to the first fault value.

7 Claims, 7 Drawing Sheets

| FLAG NAME | NON-FAULT VALUE (HEXADECIMAL) | FAULT VALUE (HEXADECIMAL) | |
|---|---|---|---|
| FIRST VOLTAGE REGULATOR STATUS FLAG | 6C | C6 | ~601 |
| SECOND VOLTAGE REGULATOR STATUS FLAG | A3 | 3A | ~602 |

DIAGNOSTIC SYSTEM FOR A VEHICLE ELECTRICAL SYSTEM HAVING A VOLTAGE REGULATOR

CROSS-REFERENCE TO RELATED APPLICATION

This application claims priority to U.S. Provisional Patent Application No. 62/538,990 filed on Jul. 31, 2017, the entire contents of which are hereby incorporated by reference herein.

BACKGROUND

The inventor herein has recognized a need for an improved diagnostic system for a vehicle electrical system having a voltage regulator that utilizes first and second applications that each independently monitor an output voltage of the voltage regulator and exchange voltage values with one another, and further determines a difference between the exchanged voltage values that indicates whether the voltage regulator is operating as desired.

SUMMARY

A diagnostic system for a vehicle electrical system in accordance with an exemplary embodiment is provided. The system has a voltage regulator outputting a first voltage. The diagnostic system includes a microcontroller having a first analog-to-digital converter, a digital input-output device, first and second applications, and a first diagnostic handler application. The diagnostic system includes a first voltage divider circuit electrically coupled between the output terminal of the voltage regulator and the first analog-to-digital converter, such that the first analog-to-digital converter receives a second voltage from the first voltage divider circuit. The first analog-to-digital converter measures the second voltage at a first time and generates a first voltage value based on the second voltage. The first application multiplies the first voltage value by a first correction value to obtain a first corrected voltage value. The first application receives a second corrected voltage value from the second application. The first application sets a first voltage regulator status flag equal to a first fault value when a difference between the first and second corrected voltage values is greater than a threshold difference value. The first diagnostic handler application commands the digital input-output device to generate control signals if the first voltage regulator status flag is equal to the first fault value.

DETAILED DESCRIPTION

Figure 1:
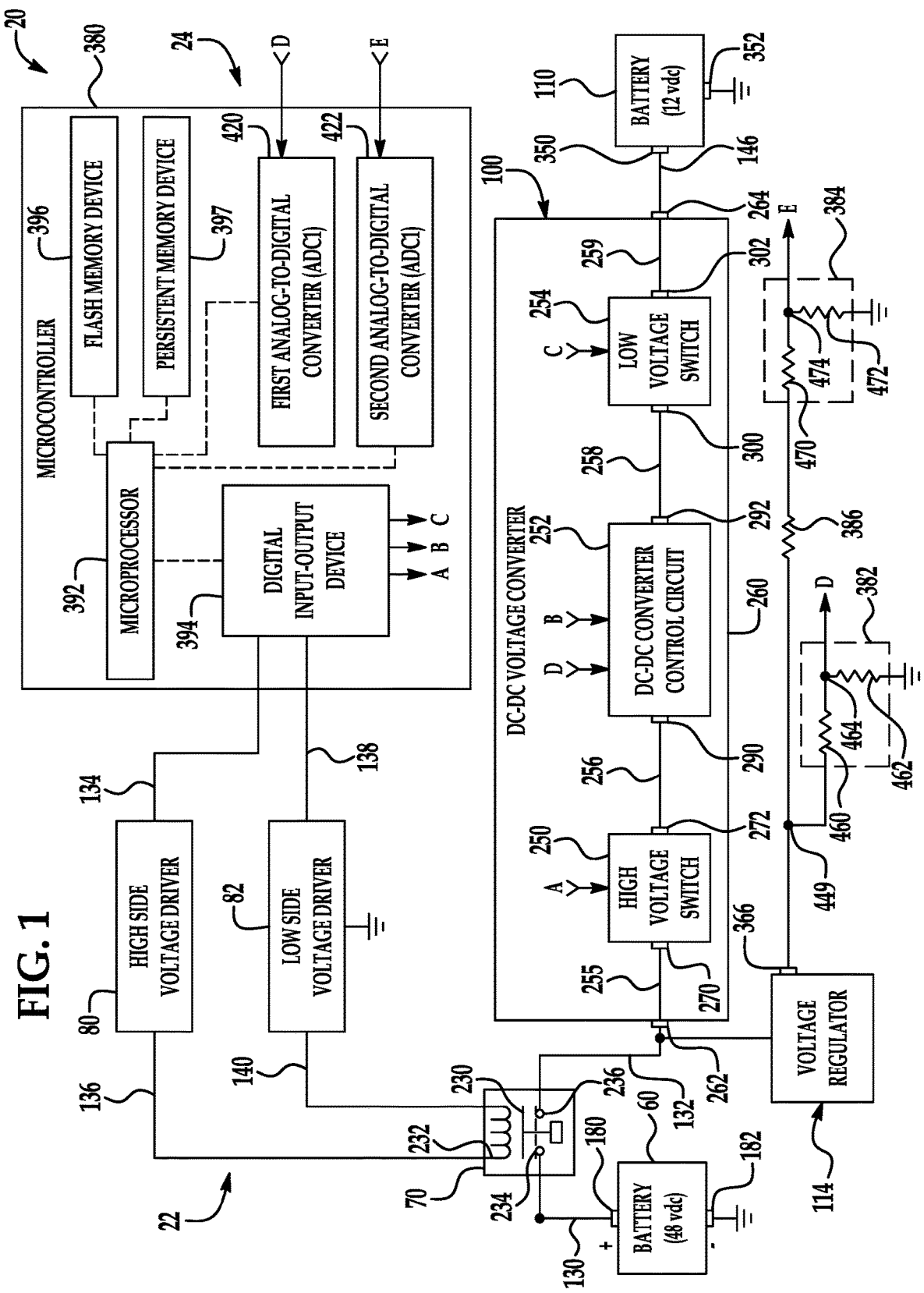
FIG. 1 is a schematic of a vehicle having a diagnostic system for a vehicle electrical system in accordance with an exemplary embodiment.

Referring to FIG. 1, a vehicle 20 is provided. The vehicle 20 includes a vehicle electrical system 22, and a diagnostic system 24 in accordance with an exemplary embodiment.

The vehicle electrical system 22 includes a battery 60, a contactor 70, a high side voltage driver 80, a low side voltage driver 82, a DC-DC voltage converter 100, a battery 110, a voltage regulator 114, and electrical lines 130, 132, 134, 136, 138, 140, 146.

Figures 2, 3:
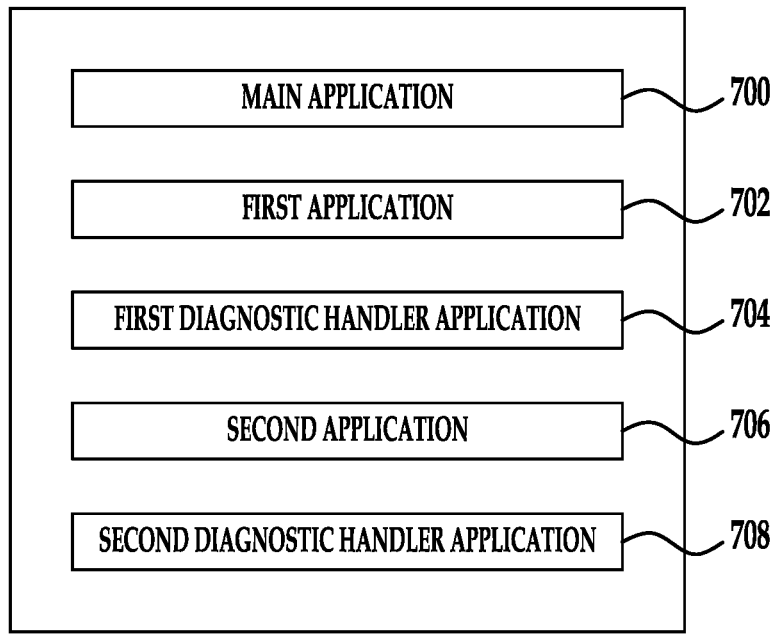
FIG. 2 is a schematic of a table having non-fault values and fault values for first and second voltage regulator status flags utilized by the diagnostic system of FIG. 1.
FIG. 3 is a block diagram of a main application, a first application, a first diagnostic handler application, a second application, and a second diagnostic handler application utilized by the diagnostic system of FIG. 1.

Referring to FIGS. 1 and 3, an advantage of the diagnostic system 24 is that the system 24 utilizes first and second applications 702, 704 that each independently monitor an output voltage of the voltage regulator 114 and exchange voltage values with one another, and further determines a difference between the exchanged voltage values that indicates whether the voltage regulator 114 is operating as desired.

For purposes of understanding, the term "node" or "electrical node" refers to a region or a location in an electrical circuit.

Also, for purposes of claim construction the terms multiplying by a correction value (e.g., multiplying a number by 5) can also be equivalent to dividing by a correction value (e.g., dividing a number by ⅕).

The battery 60 includes a positive terminal 180 and a negative terminal 182. In an exemplary embodiment, the battery 60 generates substantially 48 Vdc between the positive terminal 180 and the negative terminal 182. The positive terminal 180 is electrically coupled to a node 234 of the contactor 70. The negative terminal 182 is electrically coupled to electrical ground.

The contactor 70 has a contact 230, a contactor coil 232, a first node 234, and a second node 236. The first node 234 is electrically coupled to the positive terminal 180 of the battery 60 utilizing the electrical line 130. The second node 236 is electrically coupled to the high voltage terminal 262 of the DC-DC voltage converter 100 utilizing the electrical line 132. When the digital input-output device 394 of the microcontroller 380 generates first and second control signals that are received by the high side voltage driver 80 and the low side voltage driver 82, respectively, the contactor coil 232 is energized which transitions the contact 230 to a closed operational state. Alternately, when the digital input-output device 394 of the microcontroller 380 generates third and fourth control signals that are received by the high side voltage driver 80 and the low side voltage driver 82, respectively, the contactor coil 232 is de-energized which transitions the contact 230 to an open operational state. In an exemplary embodiment, the third and fourth control signals can each be a ground voltage level.

The high side voltage driver 80 and the low side voltage driver 82 are provided to energize or de-energize the contactor coil 232.

The high side voltage driver 80 is electrically coupled to a digital input-output device 394 of the microcontroller 380 utilizing the electrical line 134. The high side voltage driver 80 is further electrically coupled to a first end of the contactor coil 232 utilizing the electrical line 136. The high side voltage driver 144 energizes the contactor coil 232, when the high side voltage driver 144 receives a control signal from the digital input-output device 394.

The low side voltage driver 82 is electrically coupled to the digital input-output device 394 of the microcontroller 380 utilizing the electrical line 138. The low side voltage driver 82 is further electrically coupled to a second end of the contactor coil 232 utilizing the electrical line 140. The low side voltage driver 82 is configured to conduct an electrical current therethrough to the electrical ground for energizing the contactor coil 232, when the low side voltage driver 82 receives a control signal from the digital input-output device 394.

The DC-DC voltage converter 100 includes a high voltage switch 250, a DC-DC converter control circuit 252, a low voltage switch 254, electrical lines 255, 256, 258, 259, a housing 260, a high voltage terminal 262, and a low voltage terminal 264. The housing 260 holds the high voltage switch 250, the DC-DC converter control circuit 252, and the low voltage switch 254 therein.

The high voltage switch 250 includes a first node 270 and a second node 272. The first node 270 is electrically coupled to the high voltage terminal 262 utilizing the electrical line 255, and the high voltage terminal 262 is further electrically coupled to the second node 236 of the contactor 70 utilizing the electrical line 132. The second node 272 is electrically coupled to a first node 290 of the DC-DC converter control circuit 252 utilizing the electrical line 256. In an exemplary embodiment, the high voltage switch 250 is a bi-directional MOSFET switch having desired voltage and current capabilities. When the microcontroller 380 generates a first control signal that is received by the high voltage switch 250 (or that is received by a controller or a microprocessor within the DC-DC voltage converter 100 that is operably coupled to the switch 250), the microcontroller 380 induces the switch 250 to transition to a closed operational state. When the microcontroller 380 generates a second control signal, the microcontroller 380 induces the switch 250 to transition to an open operational state. In an exemplary embodiment, the second control signal is a ground level control signal.

The DC-DC converter control circuit 252 has a first node 290 and a second node 292. The DC-DC converter control circuit 252 has internal FETs that are selectively switched to convert a DC voltage received at the first node 290 to another DC voltage output at the second node 292, based on control signals from the microcontroller 380. Alternately, the DC-DC converter control circuit 252 selectively switches the internal FETs to convert a DC voltage received at the second node 292 to another DC voltage that is output at the first node 290, based on control signals from the microcontroller 380.

The low voltage switch 254 includes a first node 300 and a second node 302. The first node 300 is electrically coupled to the second node 292 of the DC-DC converter control circuit 252 utilizing the electrical line 258. The second node 302 is electrically coupled to the low voltage terminal 264 utilizing the electrical line 259, and the low voltage terminal 264 is further electrically coupled to the battery 110 utilizing the electrical line 146. In an exemplary embodiment, the low voltage switch 254 has an identical structure as the high voltage switch 250. In an exemplary embodiment, the low voltage switch 254 is a bi-directional MOSFET switch having desired voltage and current capabilities. When the microcontroller 380 generates a first control signal that is received by the low voltage switch 254 (or that is received by a controller or a microprocessor within the DC-DC voltage converter 100 that is operably coupled to the switch 254), the microcontroller 380 induces the switch 254 to transition to a closed operational state. When the microcontroller 380 generates a second control signal, the microcontroller 380 induces the switch 254 to transition to an open operational state. In an exemplary embodiment, the second control signal is a ground level control signal.

The battery 110 includes a positive terminal 350 and a negative terminal 352. In an exemplary embodiment, the battery 110 generates substantially 12 Vdc between the positive terminal 350 and the negative terminal 352. The positive terminal 350 is electrically coupled to the low voltage terminal 264 of the DC-DC voltage converter 100. The negative terminal 352 is electrically coupled to an electrical ground, which may be electrically isolated from the electrical ground associated with the battery 60.

The voltage regulator 114 has an output terminal 366 that outputs a voltage (e.g., 5 Vdc). The output terminal 366 is electrically coupled to a node 449, and may be further electrically coupled to the microcontroller 380.

The diagnostic system 24 determined whether the voltage regulator 114 is operating as desired, and if not the diagnostic system 24 takes a safe action of opening the contactor 70. The diagnostic system 24 includes a microcontroller 380, a first voltage divider circuit 382, a second voltage divider circuit 384, and a resistor 386. The microcontroller 380 has a microprocessor 392, a digital input-output device 394, a flash memory device 396, a persistent memory device 397, a first analog-to-digital converter 420, and a second analog-to-digital converter 422.

Referring to FIG. 1, the microcontroller 380 is programmed to monitor a voltage output by the voltage regulator 114 utilizing the microprocessor 392 which executes software applications stored in the flash memory device 396. The microprocessor 392 is operably coupled to the digital input-output device 394, the flash memory device 396, the first analog-to-digital converter 420, and the second analog-to-digital converter 422. The digital input-output device 394 outputs digital control signals that are received by the voltage drivers 80, 82 for controlling the operation of the contactor 70. Referring to FIGS. 1 and 2, the persistent memory device 397 stores the table 600 therein which will be described in greater detail below.

The first voltage divider circuit 382 is provided to divide the first voltage that is output from the voltage regulator 114, and to output a second voltage to the first analog-to-digital converter 420. The first voltage divider circuit 382 includes resistors 460, 462. The resistor 460 is electrically coupled to and between the electrical node 449 and an electrical node 464 (and the first analog-to-digital converter 420). Further, the resistor 462 is electrically coupled to and between the electrical node 464 and electrical ground. In an exemplary embodiment, the resistor 460 has a resistance of 2,000 ohms, and the resistor 462 has a resistance of 3,000 ohms. The first analog-to-digital converter 420 measures the second voltage at the node 464 and generates a first voltage value based on the second voltage.

The resistor 386 is electrically coupled to and between the output terminal 366 of the voltage regulator 114 and the second voltage divider circuit 384. In an exemplary embodiment, the resistor 386 as a resistance of 1 mega-ohm.

The second voltage divider circuit 384 is provided to divide the voltage that is that is received from the resistor 386, and to output a third voltage to the second analog-to-digital converter 422. The second voltage divider circuit 384 includes resistors 470, 472. The resistor 470 is electrically coupled to and between the resistor 386 and the electrical node 474 (and the second analog-to-digital converter 422). Further, the resistor 472 is electrically coupled between the node 474 and electrical ground. In an exemplary embodiment, the resistor 470 has a resistance of 4,000 ohms, and the resistor 472 has a resistance of 1,000 ohms. The second analog-to-digital converter 422 measures the third voltage at the node 474 and generates a second voltage value based on the third voltage.

Referring to FIGS. 1 and 2, a table 600 that is stored in the persistent memory device 397 and utilized by the microcontroller 380 is shown. The table 600 includes records 601, 602. The table 600 includes values that are utilized for setting the values of voltage regulator status flags associated with the voltage regulator 114. A status flag can either have a fault value indicating a fault operational condition or a non-fault value indicating a non-fault operational condition. In particular, the record 601 is associated with a first voltage regulator status flag. The record 601 includes a fault value of "6C" hexadecimal, and a non-fault value of "C6" hexadecimal. Further, the record 602 is associated with a second voltage regulator status flag. The record 602 includes a fault value of "A3" hexadecimal, and a non-fault value of "3A" hexadecimal.

The non-fault value and fault value in the record 601 have a Hamming distance of four from one another to eliminate memory overwrite errors associated with status flags utilizing the values. Further, the non-fault value and fault value in the record 602 have a Hamming distance of four from one another. Further, the non-fault value in the record 601 and the non-fault value in the record 602 have a Hamming distance of four for one another. Still further, the fault value in the record 601 and the fault value in the record 602 have a Hamming distance of four from one another.

Referring to FIGS. 1, 3 and 4-8, a method of operating the diagnostic system 24 will now be explained. The method utilizes a main application 700, a first application 702, a first diagnostic handler application 704, a second application 706, and a second diagnostic handler application 708.

Figure 4:
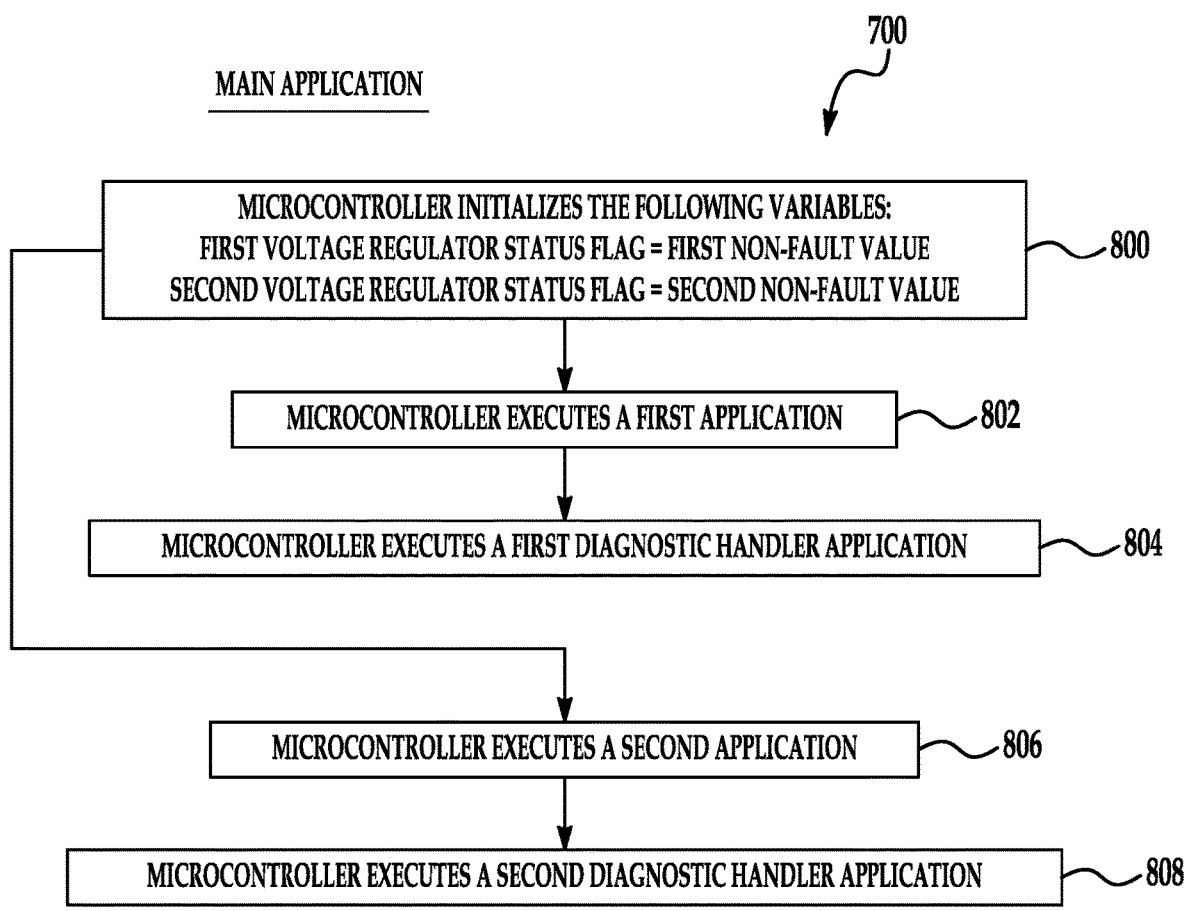
FIG. 4 is a flowchart of the main application of FIG. 3.
Figure 5:
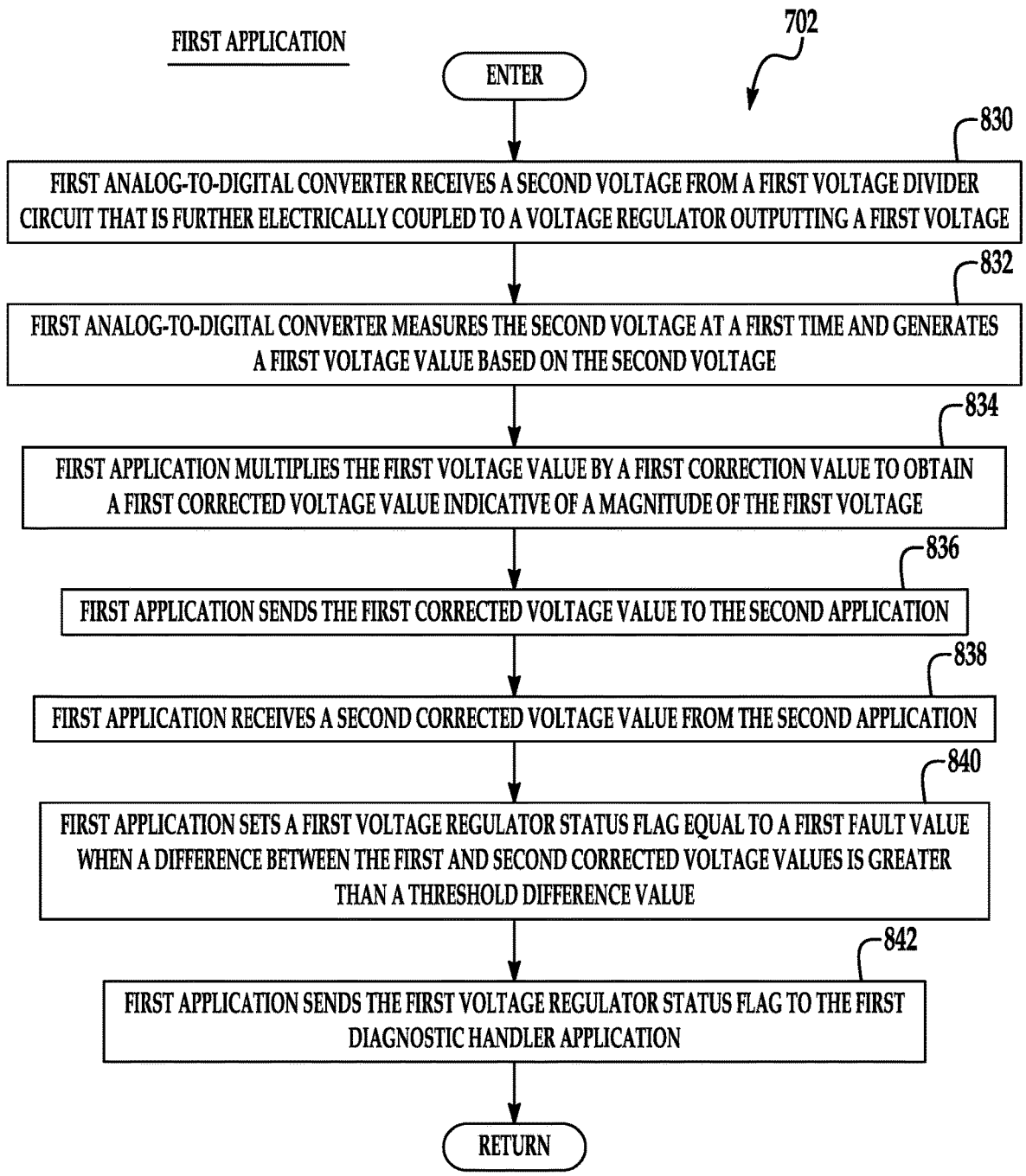
FIG. 5 is a flowchart of the first application of FIG. 3.

Referring to FIGS. 1 and 4, the main application 700 will now be explained.

At step 800, the microcontroller 380 initializes the following variables:

first voltage regulator status flag=first non-fault value (e.g., 6C hexadecimal from record 601 in table 600 in FIG. 2);

second voltage regulator status flag=second non-fault value (e.g., A3 hexadecimal from record 602 in table 600 in FIG. 2).

At step 802, the microcontroller 380 executes a first application 702.

At step 804, the microcontroller 380 executes a first diagnostic handler application 704.

At step 806, the microcontroller 380 executes a second application 706. It is noted that the first and second applications 702, 706 can be concurrently executed in first and second threads, respectively.

At step 808, the microcontroller 380 executes a second diagnostic handler application 708.

Referring to FIGS. 1 and 4, the first application 702 will now be explained.

At step 830, the first analog-to-digital converter 420 receives a second voltage from a first voltage divider circuit 382 that is further electrically coupled to a voltage regulator 114 outputting a first voltage.

At step 832, the first analog-to-digital converter 420 measures the second voltage at a first time and generates a first voltage value based on the second voltage.

At step 834, the first application 802 multiplies first voltage value by a first correction value to obtain a first corrected voltage value indicative of a magnitude of the first voltage.

At step 836, the first application 802 sends the first corrected voltage value to the second application 706.

At step 838, the first application 802 receives a second corrected voltage value from the second application 706.

At step 840, the first application 802 sets a first voltage regulator status flag equal to a first fault value (e.g., C6 hexadecimal from record 601 in table 600 in FIG. 2) when a difference between the first and second corrected voltage values is greater than a threshold difference value.

At step 842, the first application 802 sends the first voltage regulator status flag to the first diagnostic handler application 704.

Figure 6:
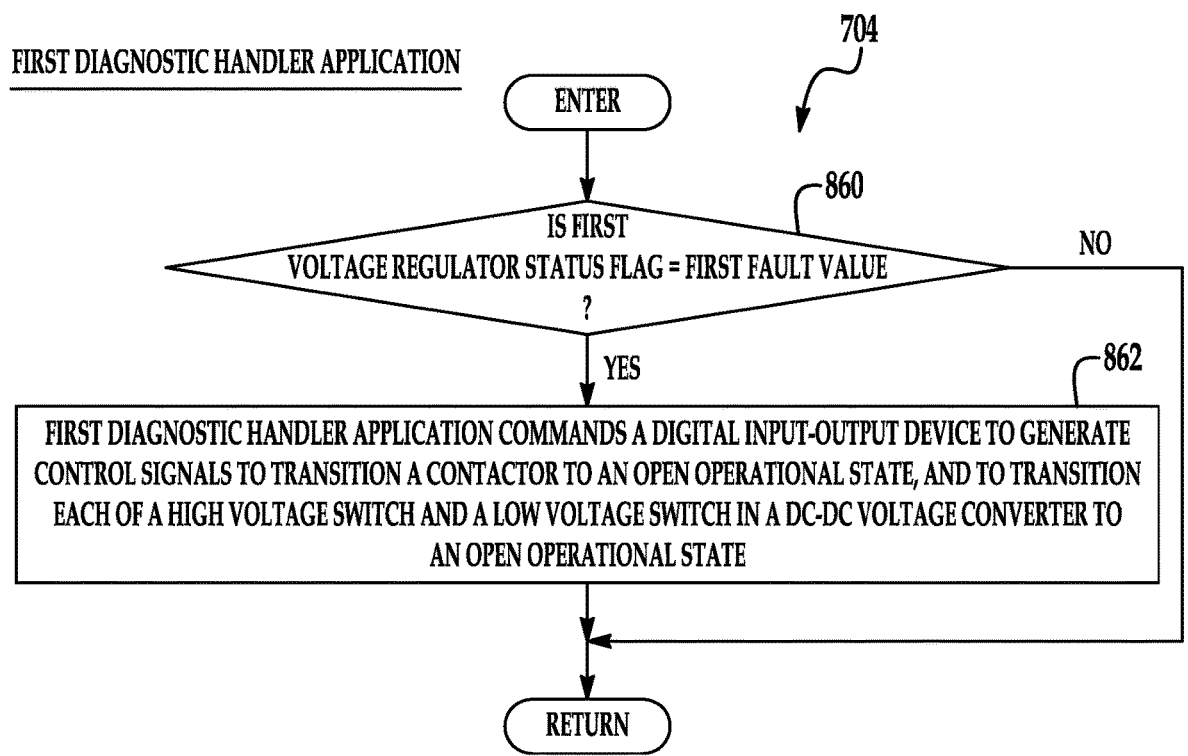
FIG. 6 is a flowchart of the first diagnostic handler application of FIG. 3.

Referring to FIGS. 1 and 6, the first diagnostic handler application 704 will be explained.

At step 860, the first diagnostic handler application 704 makes a determination as to whether the first voltage regulator status flag is equal to a first fault value (e.g., C6 hexadecimal). If the value of step 860 equals "yes", the method advances to step 862. Otherwise, the method returns to the main application 700.

At step 862, the first diagnostic handler application 704 commands a digital input-output device 394 to generate control signals to transition a contactor 70 to an open operational state, and to transition each of a high voltage switch 250 and a low voltage switch 254 in a DC-DC voltage converter 100 to an open operational state. After step 862, the method returns to the main application 700.

Figure 7:
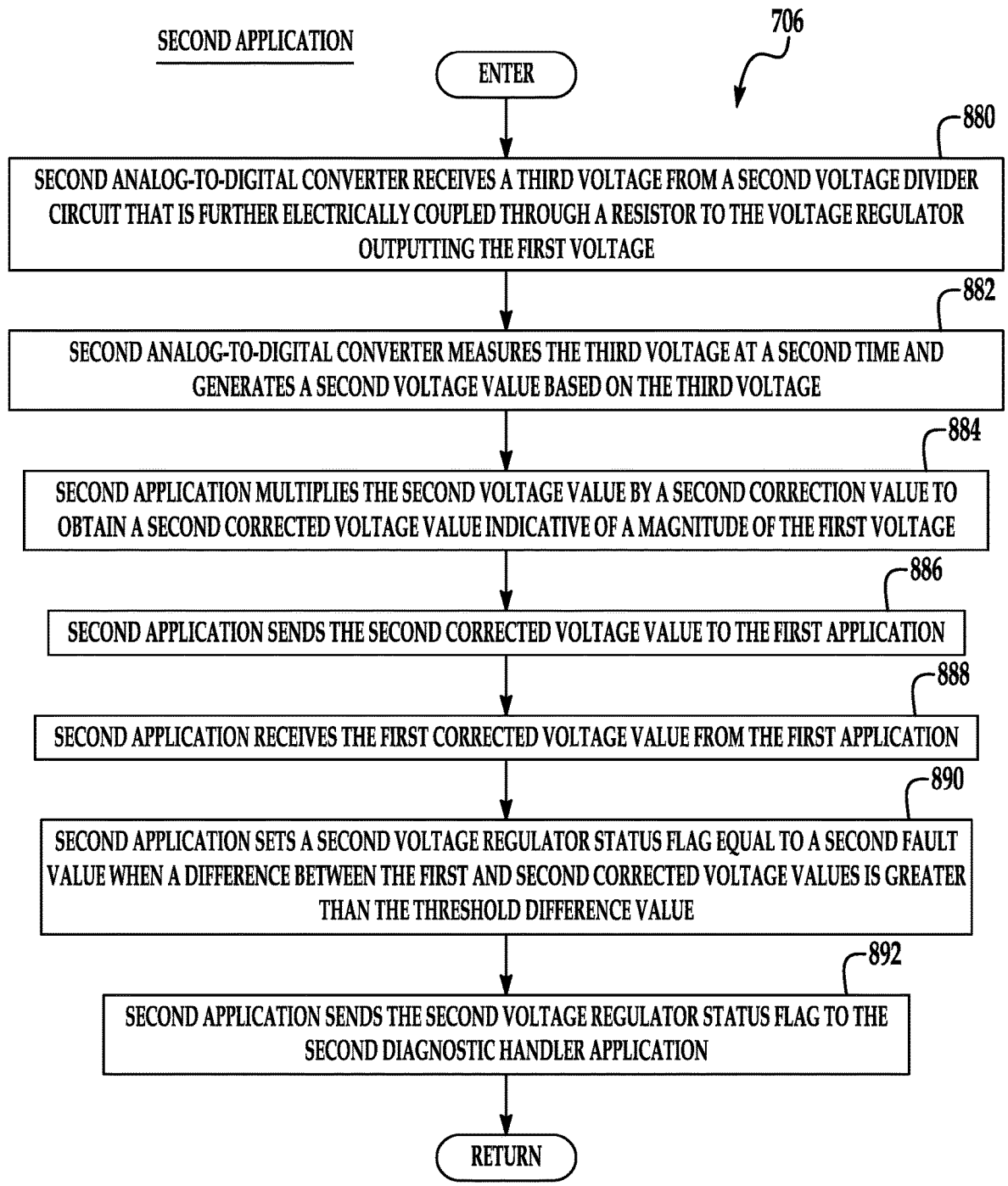
FIG. 7 is a flowchart of a second application of FIG. 3.

Referring to FIGS. 1 and 7, the second application 706 will now be explained.

At step 880, the second analog-to-digital converter 422 receives a third voltage from a second voltage divider circuit 384 that is further electrically coupled through a resistor 386 to the voltage regulator 114 outputting the first voltage.

At step 882, the second analog-to-digital converter 422 measures the third voltage at a second time and generates a second voltage value based on the third voltage.

At step 884, the second application 706 multiples the second voltage value by a second correction value to obtain a second corrected voltage value indicative of a magnitude of the first voltage.

At step 886, the second application 706 sends the second corrected voltage value to the first application 802.

At step 888, the second application 706 receives the first corrected voltage value from the first application 802.

At step 890, the second application 706 sets a second voltage regulator status flag equal to a second fault value (e.g., 3A hexadecimal from record 601 in table 600 in FIG. 2) when a difference between the first and second corrected voltage values is greater than the threshold difference value.

At step 892, the second application 706 sends the second voltage regulator status flag to the second diagnostic handler application 708.

Figure 8:
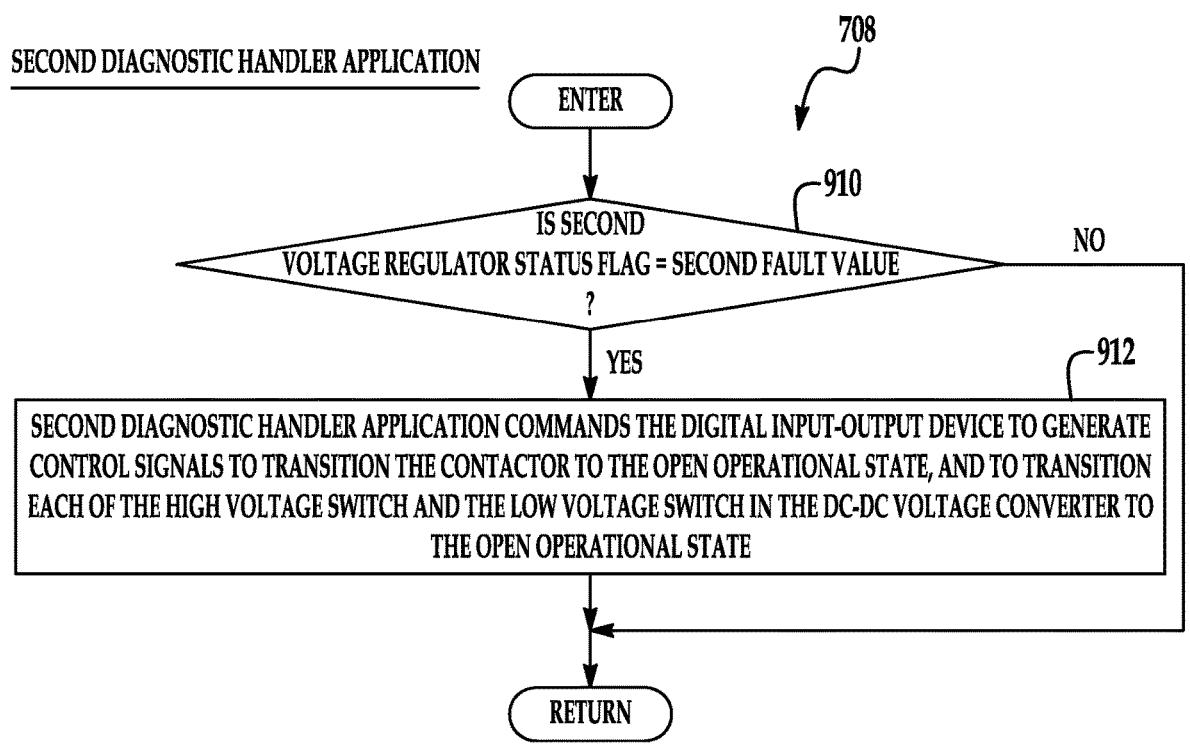
FIG. 8 is a flowchart of a second diagnostic handler application of FIG. 3.

Referring to FIGS. 1 and 8, the second diagnostic handler 708 will now be explained.

At step 910, the second diagnostic handler 708 makes a determination as to whether the second voltage regulator status flag is equal to a second fault value (e.g., 3A hexadecimal). If the value of step 910 equals "yes", the method advances to step 912. Otherwise, the method returns to the main application 700.

At step 912, the second diagnostic handler application 708 commands the digital input-output device 394 to generate control signals to transition the contactor 70 to the open operational state, and to transition each of the high voltage switch 250 and the low voltage switch 254 in a DC-DC voltage converter 100 to the open operational state. After step 912, the method returns to the main application 700.

The diagnostic system described herein for a vehicle electrical system having a voltage regulator provides a substantial advantage over other systems. In particular, the diagnostic system described herein utilizes first and second applications that each independently monitor an output voltage of the voltage regulator and exchange voltage values with one another, and further determines a difference between the exchanged voltage values that indicates whether the voltage regulator is operating as desired.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A diagnostic system for a vehicle electrical system having a voltage regulator outputting a first voltage, comprising: a microcontroller having a first analog-to-digital converter, a digital input-output device, first and second applications, and a first diagnostic handler application; a first voltage divider circuit electrically coupled between the voltage regulator and the first analog-to-digital converter, such that the first analog-to-digital converter receives a second voltage from the first voltage divider circuit; the first analog-to-digital converter measuring the second voltage at a first time and generating a first voltage value based on the second voltage; the first application multiplying the first voltage value by a first correction value to obtain a first corrected voltage value; the first application sends the first corrected voltage value to the second application; the first application receiving a second corrected voltage value from the second application; the first application setting a first voltage regulator status flag equal to a first fault value when a difference between the first and second corrected voltage values is greater than a threshold difference value; and the first diagnostic handler application commanding the digital input-output device to generate control signals if the first voltage regulator status flag is equal to the first fault value.

2. The diagnostic system of claim 1, wherein the control signals from the digital input-output device transition a contactor to an open operational state.

3. The diagnostic system of claim 1, wherein the control signals from the digital input-output device transition each of a high voltage switch and a low voltage switch in a DC-DC voltage converter to an open operational state.

4. The diagnostic system of claim 1, wherein the microcontroller further includes a second analog-to-digital converter and a second diagnostic handler application; the diagnostic system further comprising:
   a first resistor coupled between the voltage regulator and a second voltage divider circuit;
   the second voltage divider circuit being further electrically coupled to the second analog-to-digital converter such that the second analog-to-digital converter receives a third voltage from the second voltage divider circuit;
   the second analog-to-digital converter measuring the third voltage at a second time and generating a second voltage value based on the third voltage;
   the second application multiplying the second voltage value by a second correction value to obtain the second corrected voltage value;
   the second application receiving the first corrected voltage value from the first application;
   the second application setting a second voltage regulator status flag equal to a second fault value when a difference between the first and second corrected voltage values is greater than the threshold difference value; and
   the second diagnostic handler application generating control signals if the second voltage regulator status flag is equal to the second fault value.

5. The diagnostic system of claim 4, wherein the control signals from the digital input-output device transition a contactor to an open operational state.

6. The diagnostic system of claim 4, wherein the control signals from the digital input-output device transition each of a high voltage switch and a low voltage switch in a DC-DC voltage converter to an open operational state.

7. The diagnostic system of claim 4, wherein the first and second fault values have a Hamming distance of four from one another.

* * * * *